United States Patent
Matsumoto et al.

(10) Patent No.: US 6,841,880 B2
(45) Date of Patent: Jan. 11, 2005

(54) SEMICONDUCTOR DEVICE AND METHOD OF FABRICATING SEMICONDUCTOR DEVICE WITH HIGH CMP UNIFORMITY AND RESISTANCE TO LOSS THAT OCCURS IN DICING

(75) Inventors: Akira Matsumoto, Kanagawa (JP); Tadashi Fukase, Kanagawa (JP); Manabu Iguchi, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 10/715,503

(22) Filed: Nov. 19, 2003

(65) Prior Publication Data
US 2004/0145028 A1 Jul. 29, 2004

(30) Foreign Application Priority Data
Jan. 29, 2003 (JP) ........................................ 2003-021084

(51) Int. Cl.[7] .............................................. H01L 23/48
(52) U.S. Cl. ..................... 257/773; 257/208; 257/211; 257/207; 438/618
(58) Field of Search ......................... 257/207–211, 773; 438/618

(56) References Cited

U.S. PATENT DOCUMENTS 6,528,818 B1 * 3/2003 Satya et al.
6,614,120 B2 * 9/2003 Sato et al. ................... 257/758

FOREIGN PATENT DOCUMENTS

| JP | 2000-286263 | 10/2000 |
|---|---|---|
| JP | 3128205 | 11/2000 |
| JP | 2001-203261 | 7/2001 |
| JP | 2002-208676 | 7/2002 |

* cited by examiner

*Primary Examiner*—Fetsum Abraham
(74) *Attorney, Agent, or Firm*—Young & Thompson

(57) ABSTRACT

In the semiconductor device of the present invention, a plurality of dummy patterns are formed in a grid arrangement in the scribe line areas of a wafer, and a plurality of dummy patterns are formed in a diagonally forward skipped arrangement in the chip interior areas of the wafer. Altering the arrangement of dummy patterns in the chip interior areas and scribe line areas in this way enables formation of dummy patterns with greater uniformity in the chip interior areas and enables formation of dummy patterns with greater resistance to loss that occurs when dicing in scribe line areas.

9 Claims, 5 Drawing Sheets

The area in which the dummy patterns are removed

SEMICONDUCTOR DEVICE AND METHOD OF FABRICATING SEMICONDUCTOR DEVICE WITH HIGH CMP UNIFORMITY AND RESISTANCE TO LOSS THAT OCCURS IN DICING

BACKGROUND OF THE INVENTION

1. Field of the Invention

The present invention relates to a semiconductor device and to a method of fabricating the device; and more particularly to a semiconductor device on which dummy patterns are formed on a wiring layer and to the method of fabricating the device.

2. Description of the Related Art

In a conventional method of fabricating a semiconductor device having a multiple interconnection layers, when a method is adopted in which a wiring layer is formed by filling trenches with a metal, CMP (Chemical Mechanical Polishing) is used to remove unnecessary metal except the metal that has been embedded in the trenches. In such a case, a wiring pattern that has been formed unevenly on the wafer will cause variation in the polishing speed, and a countermeasure therefore is necessary for limiting variation in the film thickness of the wiring that is finally formed. For this purpose, a method has been conventionally adopted in which dummy patterns are arranged on the normal wiring layer. The dummy patterns referred to here are wiring patterns that are formed in scattered areas as a pseudo wiring pattern simultaneously with the wiring pattern, and moreover, by the same method as the wiring pattern.

The easiest and most typical method of generating a dummy wiring pattern on data involves arranging uniform dummy patterns over the entire surface of pattern data and then removing the unnecessary dummy patterns based on a logical operation with the actual wiring pattern. This type of logical operation method is described in the specification of, for example, Japanese Patent No. 3128205.

FIG. 1 shows the arrangement of dummy patterns formed on a wafer in the prior art. A plurality of chip areas 1 and scribe line areas 2 that demarcate each of chip areas 1 are provided on a wafer, and dummy patterns 3 and 4 are formed in areas 1 and 2, respectively. These dummy patterns are formed as square shapes, and the dummy patterns can be evenly generated in a grid composed of 5 by 5 squares as shown in FIG. 6 (to be described hereinbelow) by successively arranging these patterns in squares next to (in the example shown in FIG. 1 and FIG. 6, to the right of) squares that are two squares away in all directions: upward, downward, to the left and to the right of a particular dummy pattern. In the following explanation, this arrangement of dummy patterns will be referred to as the "diagonally forward skipped arrangement".

When semiconductor devices are cut from a wafer to chip size by dicing, a process is carried out in which the wafer is cut by means of a diamond cutter. The occurrence of nonuniformity in the pattern that is formed on the cutting space of this cutter causes variation in the hardness of the wafer encountered by the cutter, and this variation tends to cause loss during cutting. In particular, when the pattern is scattered, the hardness is uniform in that portion, and loss that has once occurred tends to spread over a large area, resulting in an expanded area of loss. A construction having the "diagonally forward skipped arrangement" described hereinabove entails an increased probability that the arrangement of the dummy pattern will become sparse with respect to the direction of advance of the cutter and that a greater loss will thus occur.

In addition, in the interest of improving the performance of semiconductor devices, recent years have seen the increased use of partial films having a low dielectric constant as the insulating film between wiring layers. Typically, a film having a low dielectric constant itself has a low level of hardness, and further, has a low level of adhesion to the silicon oxide films or silicon nitride films that have been used conventionally as interlayer insulating films, and the use of a film having a low dielectric constant as the insulating film between wiring layers will therefore result in more extreme loss during dicing.

The more concentrated arrangement of dummy patterns in a grid form results in dummy patterns that are arranged evenly with respect to the direction of the advance of the cutter and thus reduces the areas of loss. Nevertheless, the arrangement of dummy patterns in grid form over the entire surface of a wafer causes unevenness in the arrangement of the dummy patterns within the chip areas. This is because, in a construction in which wiring patterns of chip interior areas are arranged in one direction (vertical direction or horizontal direction) in all areas, as is normal, excessive separation will occur between areas in which the dummy patterns remain and areas in which the dummy patterns are removed as shown in FIG. 4 when the operation is performed for eliminating unnecessary patterns as described hereinabove (refer to FIGS. 2–4).

SUMMARY OF THE INVENTION

It is an object of the present invention to provide a semiconductor device and a method of fabricating a semiconductor device in which dummy patterns are evenly formed in chip interior areas, and moreover, in which dummy patterns having superior resistance to loss when dicing are formed in scribe line areas.

According to the present invention, a plurality of dummy patterns are formed in a grid arrangement in the scribe line areas of a wafer and a plurality of dummy patterns are formed in a diagonally forward skipped arrangement in the chip interior areas of the wafer. This alteration of the dummy pattern arrangement enables the formation of dummy patterns with high uniformity in chip interior areas and enables the formation of dummy patterns with high resistance to the loss that occurs during dicing in scribe-line areas, thereby allowing an improvement in both the yield and the reliability of semiconductor chips that are obtained by cutting from a wafer.

Further, each of the dummy patterns that are formed in scribe-line areas may have a square shape or a rectangular shape, and each of the dummy patterns that are formed in areas within chips may have a square shape.

The above and other objects, features, and advantages of the present invention will become apparent from the following description with reference to the accompanying drawings, which illustrate examples of the present invention.

DETAILED DESCRIPTION OF THE PREFERRED EMBODIMENTS

Figure 1:
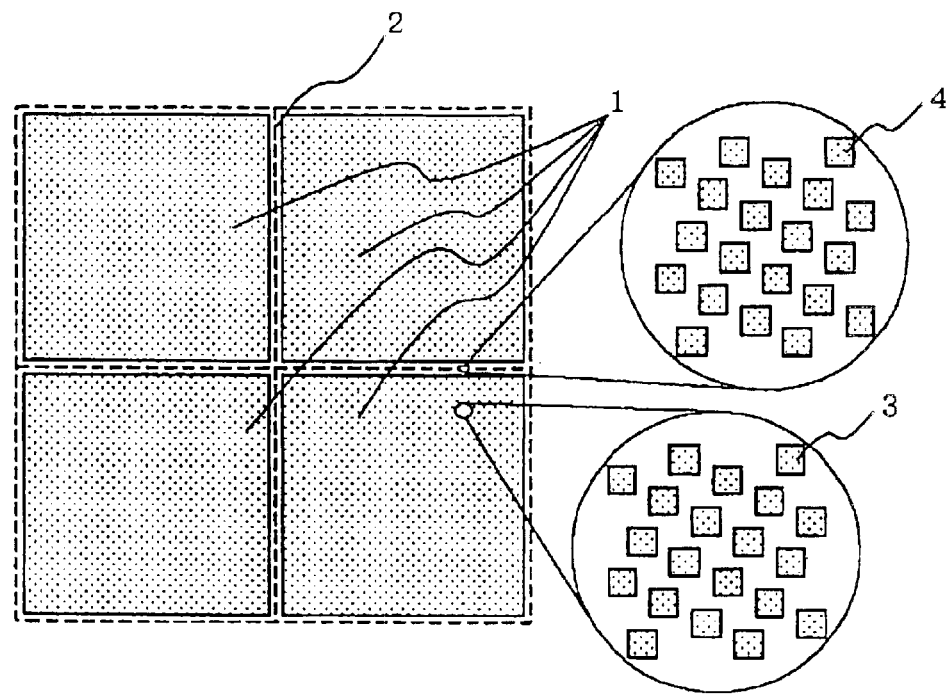
FIG. 1 is a plan view showing the arrangement of dummy patterns of the prior art.
Figure 2:
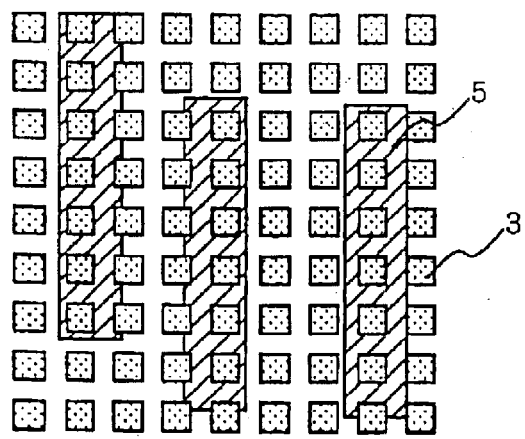
FIG. 2 is a plan view showing the first stage of the process of generating dummy patterns in a grid arrangement.
Figure 3:
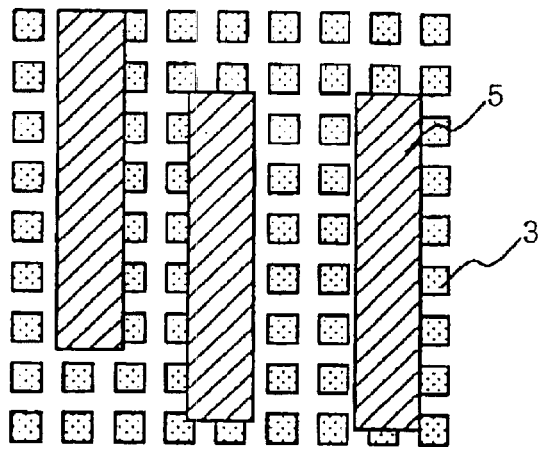
FIG. 3 is a plan view showing the second stage of the process of generating dummy patterns in a grid arrangement.
Figure 4:
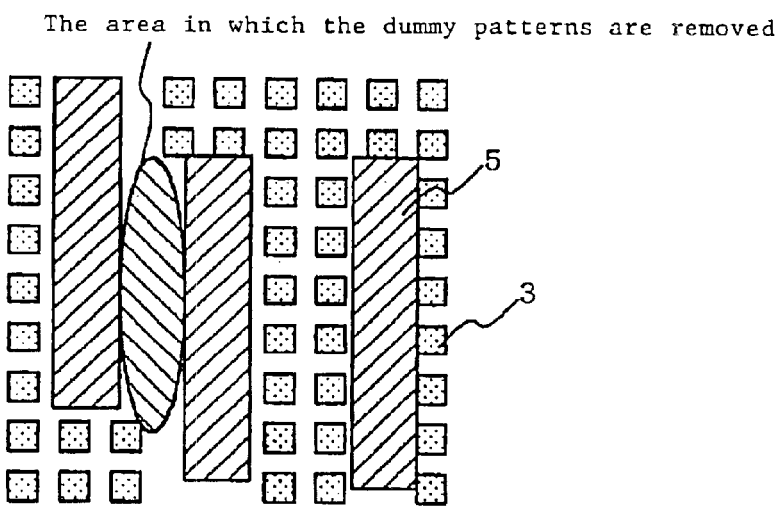
FIG. 4 is a plan view showing the third stage of the process of generating dummy patterns in a grid arrangement.
Figure 5:
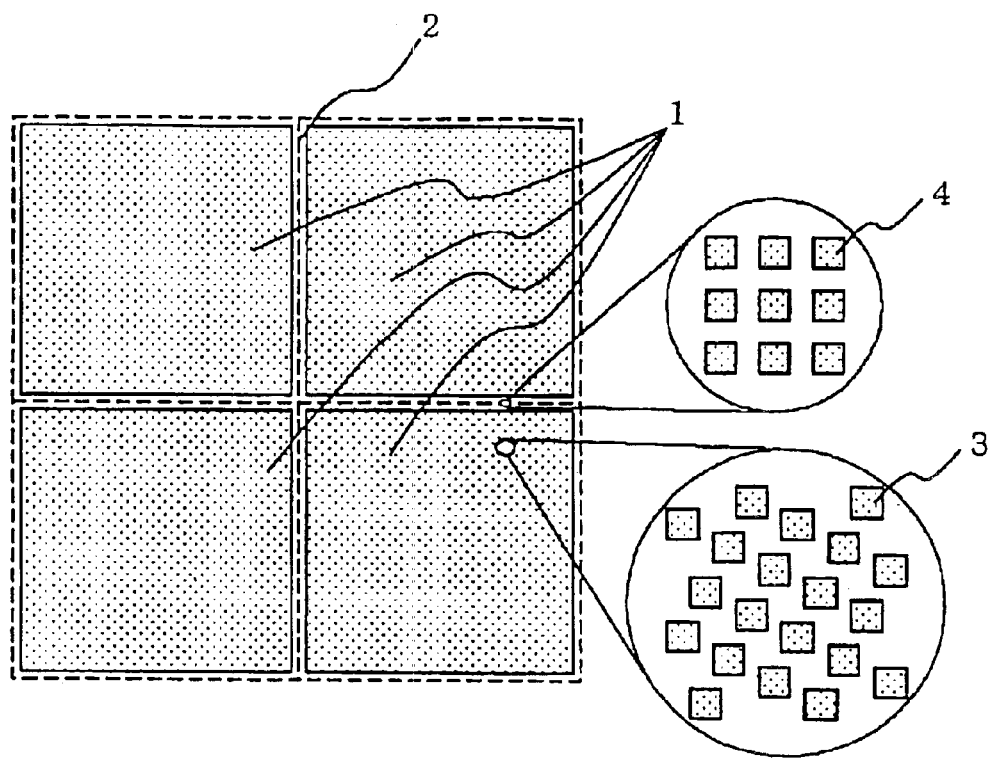
FIG. 5 is a plan view showing a semiconductor device according to the first embodiment of the present invention.

FIG. 5 is a plan view showing the arrangement of dummy pattern wiring in a semiconductor device according to the first embodiment of the present invention, and in particular, in a semiconductor device that uses a trench construction for forming wiring lines.

Referring to FIG. 5, scribe line areas 2 having a width of 100 $\mu$m are provided around the peripheries of chip areas 1 that have been formed on a silicon wafer. Dummy patterns 3 having a square shape measuring 2 $\mu$m on each side are arranged in the "diagonally forward skipped arrangement" in chip areas 1.

Figure 6:
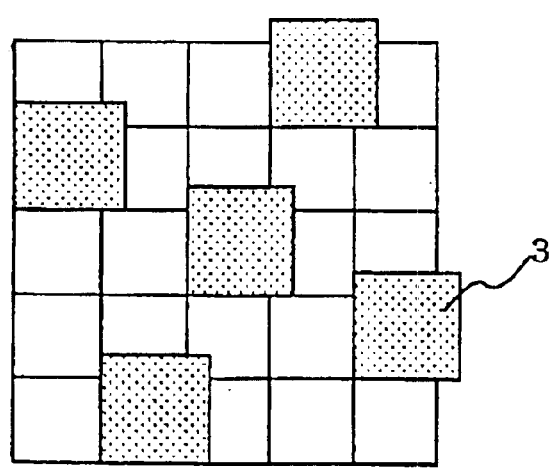
FIG. 6 is a plan view showing the diagonally forward skipped arrangement of dummy patterns.

More specifically, as shown in FIG. 6, dummy patterns 3 are arranged within grids that are repeated horizontally and vertically over the entire surface of chip areas 1, one grid being made up by 5 by 5 squares (a total of 25 squares) each square measuring 1.7 $\mu$m on a side arranged horizontally and vertically. In this arrangement, dummy patterns 3 are not uniformly arranged in the vertical direction, horizontal direction, and 45 degrees diagonal direction. In the present embodiment, the order of arrangement of dummy pattern 3 on the lower side coincides with the order of arrangement of dummy pattern 3 on the left side of one grid of 5 by 5 squares in the figure. In other words, dummy pattern 3 is arranged at the second square from the left on the lower side of the grid, and dummy pattern 3 is arranged at the second square from the top on the left side of the grid. In the present embodiment, moreover, in one unit of 5 by 5 squares, a total of four dummy patterns 3 are provided at neighboring squares that are two squares over and one square to the right in all directions: upward, downward, to the right, and to the left; as seen from dummy pattern 3 that is arranged at the center of the one unit. Alternatively, in one unit, a total of four dummy patterns 3 may also be provided at neighboring squares that are two squares over and one square to the left in all directions: upward, downward, to the left, and to the right; as seen from dummy pattern 3 that is arranged at the center of the one unit.

In addition, although each dummy pattern 3 is larger than one square in the present embodiment, the size of dummy patterns 3 can be varied as appropriate. The size of dummy patterns 3 is set in consideration of the density of wiring layout, and it is therefore possible, for example, for each dummy pattern 3 to be equal in size to each square, or for each dummy pattern 3 to be smaller than each square.

Figure 7:
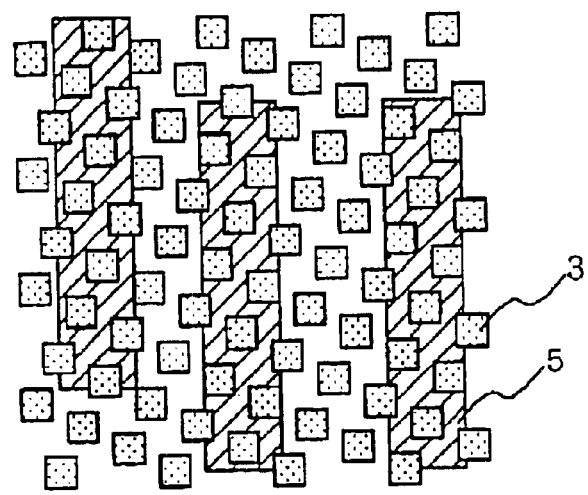
FIG. 7 is a plan view showing the first stage of the process of generating dummy patterns in the diagonally forward skipped arrangement.
Figure 8:
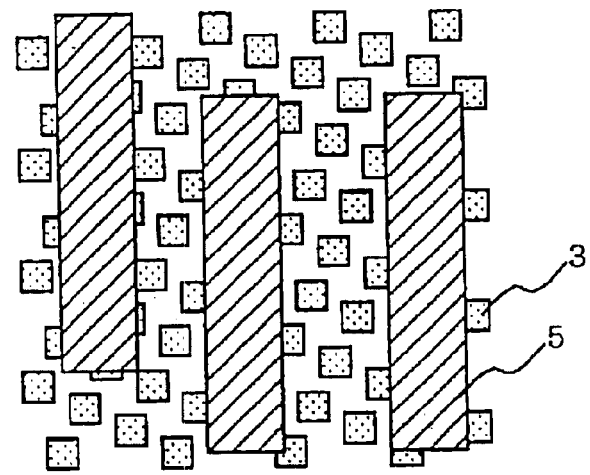
FIG. 8 is a plan view showing the second stage of the process of generating dummy patterns in the diagonally forward skipped arrangement.
Figure 9:
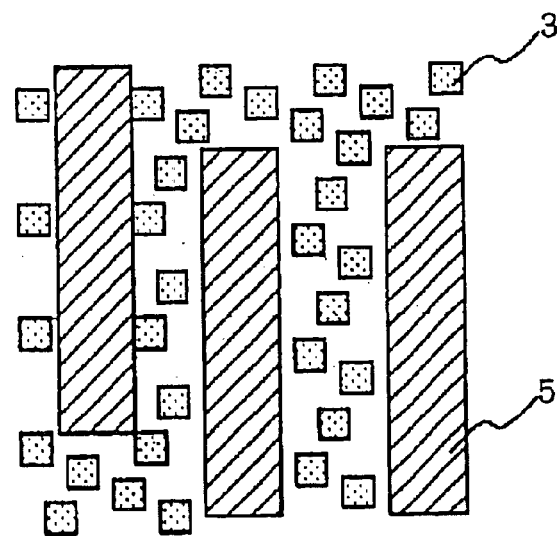
FIG. 9 is a plan view showing the third stage of the process of generating dummy patterns in the diagonally forward skipped arrangement.

FIGS. 7 to 9 show the method of designing the arrangement of dummy patterns in the present embodiment.

Dummy patterns 3 can be automatically generated by using computer software that can execute the processes of: first employing a logical operation to avoid interference with the actual pattern and thus obtain the logical product of actual wiring pattern 5 and dummy pattern 3 (see FIG. 7); deleting dummy patterns 3 that overlap this actual wiring pattern 5 (see FIG. 8); and further deleting dummy patterns that do not attain a prescribed size (see FIG. 9).

The wiring of an actual pattern is typically arranged parallel vertically or horizontally, and as a result, when the arrangement of the dummy pattern is for example a grid arrangement, the use of a logical operation as described hereinabove has the potential of generating areas in which there are no dummy patterns over areas that extend long distances vertically or horizontally. The arrangement of wiring patterns that include actual patterns and dummy patterns consequently becomes uneven, thereby preventing uniform CMP. On the other hand, when dummy patterns are arranged in the "diagonally forward skipped arrangement", the direction of arrangement of the dummy patterns diverges from the direction of arrangement of the actual pattern, whereby even the above-described calculation method can leave uniform dummy patterns.

Referring again to FIG. 5, square-shaped dummy patterns 4 measuring 2 $\mu$m on a side are arranged in a grid form with vertical and horizontal spacing of 2 $\mu$m in scribe line areas 2. The above-described logical operation is also applicable to scribe line areas 2 to remove dummy patterns 4 that interfere with actual patterns on scribe lines (for example, patterns for alignment of exposure masks or check patterns for checking products in the wafer state). The proportion of space of the entire wafer that is occupied by scribe line areas 2 is small, and the previously described effect is therefore small even when unevenness occurs in the wiring pattern.

Since dummy patterns 4 are arranged in a grid pattern in scribe line areas 2, dummy patterns 4 and the spacing between dummy patterns 4 are aligned evenly at a ratio of 1:1 in these areas 2. As a result, scribe line areas 2 of the wafer can be considered to be a substantially uniform material in the dicing process. Accordingly, loss (breaks in the wafer or film peeling) is suppressed during dicing of scribe line areas 2. During dicing, an area having a width of approximately 30 $\mu$m in the central portion of scribe line areas 2 is cut by a cutter (for example, a rotary dicing blade). The width of the cutter used in this dicing process is 30 $\mu$m. As for cutting speed, the rotational speed of the cutter is 36,000 rpm and the speed of movement of the stage is 3 mm/sec.

Even should film peeling (in particular, peeling at the interface between the wiring metal and interlayer insulating film) occur in the dicing process, the interface in which peeling can occur is scattered with a constant narrow spacing that is equal to the pitch of dummy patterns 4, and a film peeling that occurs at one location will not extend over a large area.

Figure 10:
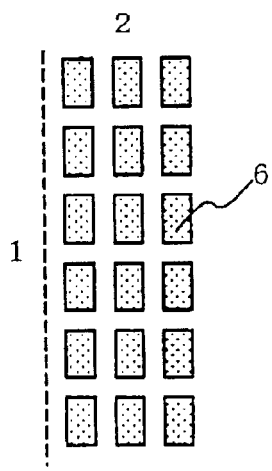
FIG. 10 is a plan view showing another shape of a dummy pattern on a scribe line.

Further, as shown in FIG. 10, the dummy patterns of scribe line areas 2 may be formed as, for example, rectangles each measuring 2 $\mu$m by 4 $\mu$m and arranged such that the longitudinal direction of these dummy patterns coincides with the direction of dicing (see reference numeral 6 in FIG. 10).

Figure 11:
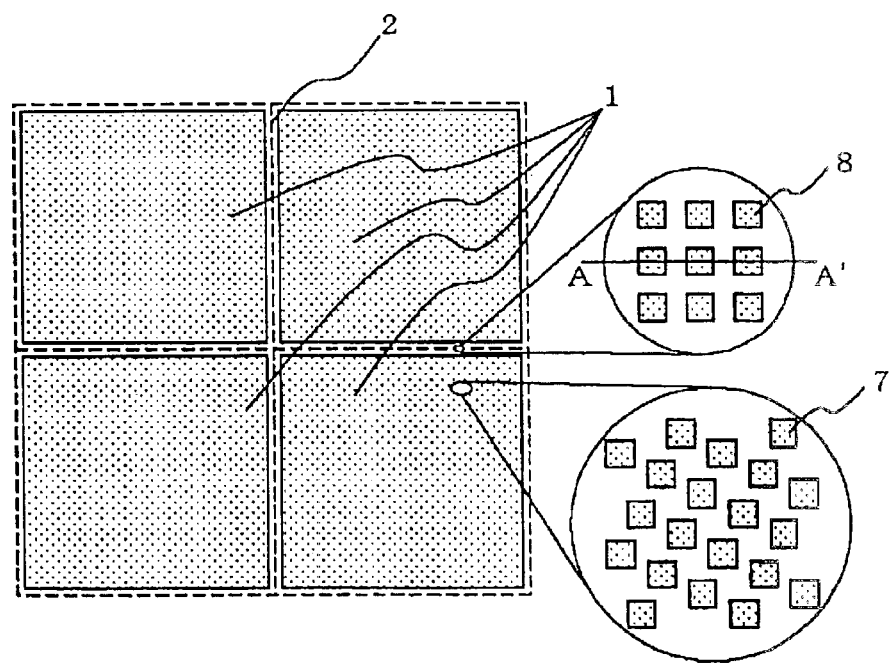
FIG. 11 is a plan view showing a semiconductor device according to the second embodiment of the present invention.

FIG. 11 shows a semiconductor device according to the second embodiment of the present invention. The semiconductor device of this embodiment has a multi-layer wiring construction with improved resistance to loss in scribe line areas 2. The present embodiment takes as example a semiconductor device having multilayer wiring that is made up of three wiring layers. The arrangement and dimensions of dummy patterns 7 and 8 in each wiring layer are similar to those of the first embodiment.

Figure 12:
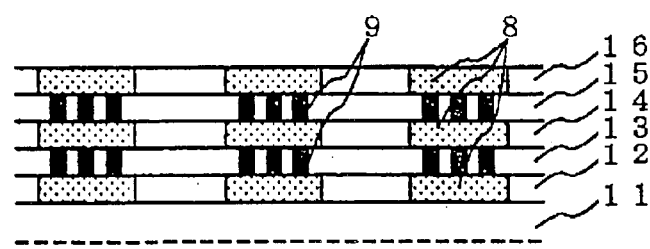
FIG. 12 is a sectional view showing dummy patterns on a scribe line in the second embodiment of the present invention.

FIG. 12 is a sectional view showing a section taken along line A—A in FIG. 11. Overlying and underlying dummy patterns 8 of each wiring layer in scribe line areas 2 are connected by via-holes 9. Via-holes 9 are formed simultaneously with and by the same method as the via-holes in actual patterns within the chips. Although only three wiring layers are shown in FIG. 12, additional insulating layers or wiring layers may of course be formed over these wiring layers in the finally formed semiconductor device.

According to the present embodiment, the use of via-holes 9 to connect dummy patterns 8 that overlie and underlie each wiring layer in scribe line areas 2 improves the adhesion between overlying and underlying dummy patterns 8, and moreover, increases the uniformity of hardness in scribe line areas 2. The present embodiment can therefore suppress the expansion of areas of loss that occur during dicing due to the low level of adhesion between dummy pattern 8 of each layer and interlayer insulating films 11–16.

While preferred embodiments of the present invention have been described using specific terms, such description is for illustrative purposes only, and it is to be understood that changes and variations may be made without departing from the spirit or scope of the following claims.

What is claimed is:

1. A semiconductor device, comprising:
   chip interior areas formed on a wafer that are provided with functional elements, and scribe line areas formed on said wafer that serve as cutting space when dicing said wafer;
   a plurality of dummy patterns arranged in a diagonally forward skipped arrangement that are formed in said chip interior areas; and
   a plurality of dummy patterns arranged in grid form that are formed in said scribe line areas.

2. A semiconductor device according to claim 1, wherein:
   said semiconductor device includes a plurality of wiring layers that are stacked together, said dummy patterns being formed in said scribe line areas of each wiring layer; and
   said dummy patterns that are formed in said scribe line areas of each of said wiring layers are connected by via-holes.

3. A method of fabricating a semiconductor device that includes chip interior areas formed on a wafer that are provided with functional elements, and scribe line areas formed on said wafer that serve as cutting space when dicing said wafer; said method comprising:
   a step of both forming a plurality of dummy patterns in a diagonally forward skipped arrangement in said chip interior areas and forming a plurality of dummy patterns in a grid arrangement in said scribe line areas.

4. A method of fabricating a semiconductor device according to claim 3, wherein each of said dummy patterns that are formed in said scribe line areas has a square shape or a rectangular shape.

5. A method of fabricating a semiconductor device according to claim 3, wherein each of said dummy patterns that are formed in said chip interior areas has a square shape.

6. A method of fabricating a semiconductor device that includes chip interior areas formed on a wafer that are provided with functional elements, and scribe line areas formed on said wafer that serve as cutting space when dicing said wafer, and that further has a plurality of wiring layers that are stacked together, said method comprising;
   a step of forming a plurality of dummy patterns in a diagonally forward skipped arrangement in said chip interior areas of each of said wiring layers and forming a plurality of dummy patterns in a grid arrangement in said scribe line areas of each of said wiring layers.

7. A method of fabricating a semiconductor device according to claim 6, wherein each of said dummy patterns that are formed in said scribe line areas of each of said wiring layers has a square shape or a rectangular shape.

8. A method of fabricating a semiconductor device according to claim 6, wherein each of said dummy patterns that are formed in said chip interior areas of each of said wiring layers has a square shape.

9. A method of fabricating a semiconductor device according to claim 6, further comprising:
   a step of connecting together said dummy patterns that are formed in said scribe line areas of each of said wiring layers by via-holes.

* * * * *